United States Patent [19]

Leibenzeder et al.

[11] Patent Number: 4,540,451

[45] Date of Patent: Sep. 10, 1985

[54] METHOD FOR MANUFACTURING A LUMINESCENT DIODE HAVING A HIGH FREQUENCY AND HIGH LIMIT FREQUENCY FOR ITS MODULATION CAPABILITY

[75] Inventors: Siegfried Leibenzeder, Erlangen; Claus Weyrich, Gauting, near Munich, both of Fed. Rep. of Germany

[73] Assignee: Siemens Aktiengesellschaft, Berlin & Munich, Fed. Rep. of Germany

[21] Appl. No.: 390,994

[22] Filed: Jun. 22, 1982

[30] Foreign Application Priority Data

Jun. 24, 1981 [DE] Fed. Rep. of Germany ....... 3124817

[51] Int. Cl.$^3$ .......................................... H01L 21/208
[52] U.S. Cl. .................................. 148/173; 148/171; 148/172; 29/569 L
[58] Field of Search ...................... 148/171, 172, 173; 29/569 L

[56] References Cited

U.S. PATENT DOCUMENTS

| | | | |
|---|---|---|---|
| 3,537,029 | 10/1970 | Kressel et al. | 148/171 |
| 3,689,330 | 9/1972 | Dosen et al. | 148/171 |
| 4,008,485 | 2/1977 | Miyoshi et al. | 148/171 |
| 4,268,327 | 5/1981 | Uragaki et al. | 29/569 L X |

OTHER PUBLICATIONS

"Leistungs-Infrarotdiode aus Gallium-Aluminium-Aresnid", Siemens Research & Development Reports, vol. 9, No. 6 (1980), by Leibenzeder et al., pp. 339–346.

Applied Physics Letters, vol. 19, No. 4, Aug. 15, 1971, entitled "Efficient Electroluminescence from Zinc-Diffused $Ga_{1-x}Al_xAs$ Diodes at 25° C." by Dierschke et al., pp. 98–100.

IEEE Transactions on Electron Devices, vol. ED-21, No. 11, Nov. 1974, titled "Frequency Response of $Ga_{1-x}Al_xAs$ Light-Emitting Diodes" by Namizaki et al., pp. 688–691.

Primary Examiner—George T. Ozaki
Attorney, Agent, or Firm—Hill, Van Santen, Steadman & Simpson

[57] ABSTRACT

A luminescent diode is comprised of n- and p-conductive layer components in which a graded bandgap is present and between which a pn-junction is present. The p-conductive layer component is produced by means of an additional zinc additive during an epitaxy processing utilized for manufacturing the device. The luminescent diode of the invention has improved efficiency and a higher modulation capability cutoff frequency.

2 Claims, 3 Drawing Figures

1

METHOD FOR MANUFACTURING A LUMINESCENT DIODE HAVING A HIGH FREQUENCY AND HIGH LIMIT FREQUENCY FOR ITS MODULATION CAPABILITY

BACKGROUND OF THE INVENTION

The present invention relates to a luminescent diode formed from a mixed crystal epitaxial layer comprising a composition $A_{1-x}{}^{III}Al_xB^V$ with a substantially continuously varying value x. A pn-junction is present in the layer formed between n and p-doped layer components.

For more than half a decade there have been luminescent diodes consisting of gallium-aluminum-arsenide in whose mixed crystal-epitaxial layer the layer-wise local concentration of the aluminum fraction, which replaces a corresponding gallium fraction, is variable with a constant gradient. Such a construction of the mixed crystal layer is designated in the art as a "graded-bandgap". Such an arrangement has a bandgap which is constantly greatly varying, corresponding to the constantly changing aluminum concentration, and has the greatest bandgap with the maximum aluminum concentration. The purpose of such a mixed crystal is to be able to allow recombination-luminescence radiation produced in a layered region with at least a virtually constant aluminum concentration to emerge from the entire mixed crystal-layer in such fashion that this radiation penetrates regions of the layer in which (on account of greater aluminum concentration there) the bandgap is greater. Thus, reabsorption of the produced luminescence radiation is prevented to this extent.

The pn-junction contained in the mixed crystal-layer of a luminescent diode with a "graded-bandgap", whose surface extends perpendicularly to the vector of the gradient of the aluminum concentration, is, in the case of these already long-known luminescent diodes, produced by means of silicon doping. The silicon has an amphoteric doping behavior in such a mixed crystal, specifically if it is dependent upon the deposition temperature.

Further details of such a known diode can be learned from "Siemens Research and Development Reports', Vol. 9, (1980), No. 6, pp. 339–346. In this state of the art publication, not only is such a known luminescent diode described, but also the pertinent method steps for manufacture, the properties of such a diode, and also its preferred application are described in detail. The contents of this publication are incorporated by reference herein.

Luminescent diodes with a "graded-bandgap" have a relatively large half-intensity width of their emission-spectrum.

In addition to the luminescent diodes of the above-described type, there are additional types of luminescent diodes. Thus, for example, luminescent diodes having a single heterostructure and having a double heterostructure are known. Such diodes containing at least two epitaxial layers are manufactured in two separate epitaxial steps.

SUMMARY OF THE INVENTION

It is an object of the present invention to disclose a luminescent diode which has a high electro-optical efficiency for its respective emission frequency range, preferably in the infrared range and/or in the visible range, and/or which has a high cutoff modulation capability frequency, in particular of at least 5 MHz. The diode must also be capable of being manufactured with minimal technological expense and a low reject rate.

This object is achieved with a luminescent diode of the type previously described wherein the conductive layer component is doped by one of the elements selected from a group consisting of tellurium, sulfur, and selenium, and wherein the p-conductive layer component has a zinc additive which over-compensates the mixed crystal epitaxial melt during formation of the p-conductive layer.

Underlying the idea of the present invention is the consideration that luminescent diodes to be manufactured economically and with only a low reject rate can be obtained only according to methods in which only a single epitaxial step is necessary. On the one hand, multiple liquid phase epitaxy performed in a sliding boat, such as in the case of heterostructures, is not only costly but also leads to contamination defects due to the fact that, during a change from the one epitaxy operation to the following epitaxy operation, the interstitial area is exposed in the gas space. In addition, underlying the invention is the knowledge that, in order to achieve a widespread technical application of a new luminiscent diode, it is necessary to reduce the great half-intensity width of the known luminescent diode with a "graded-bandgap" which is doped with silicon. It was ascertained that the large half-intensity width of the known luminescent diode can be attributed in an excessively large extension or expansion of the light generating region in the mixed crystal layer. With the invention, it was discovered that through a different type of doping, considerably lower half-intensity widths can be achieved, specifically for different wavelength values of the maximum of the respective emission curves. In addition, however, also another very significant additional feature was discovered: namely, that such luminescent diodes with the "graded-bandgap", doped according to the inventive principle, have particularly in the short wave infrared range and extending into the visible red range of emission such a high electro-optical efficiency that they exceed not only known as luminescent diodes with the "graded-bandgap", but also luminescent diodes which are produced according to substantially costlier manufacturing methods. For many technical applications, with the luminescent diodes constructed according to the invention, an upper limit or cutoff frequency for the modulations results which lies in the MHz-range and allows modulation band widths up to 5 MHz, i.e. up to the video band width.

In the invention, the part of the mixed crystal-epitaxial layer which must be of n conductivity type is doped with sulfur or selenium, or preferably with tellurium. In the manufacturing process of a luminescent diode according to the invention, these elements are already contained in the melt consisting of $A_{1-x}{}^{III}Al_xB^V$ employed in the epitaxial procedure for the manufacture of the layer. The layer construction of this n-conductive doping is continued up to the time at which a mixed crystal-composition with such an aluminum concentration is epitaxially deposited which leads to a particular bandgap which corresponds to the required emission-wavelength maximum of the spectral emission range of the diode. As is well known, as x decreases, a range of decreasing band gap values results. The particular band gap value corresponding to the desired wavelength lies within this range. At this time, zinc is added to the melt from which the epitaxial layer is further continuously being deposited. The element zinc can be supplied via the gas phase or also as solid matter. The doping effect of the zinc is such that the n-conductive coating of the doping agent, still further contained in the melt, is overcompensated to such an extent that now layer growth with p-type conductivity results.

Preferably for luminescent diodes a gallium-aluminum-arsenide is employed as the composition for the mixed crystal epitaxial layer. Particularly advantageous is the application of the liquid phase-epitaxy. With respect to the indicated dopings, the combination of tellurium with zinc is preferred and it is advantageous to add the zinc from the gas phase.

DESCRIPTION OF THE PREFERRED EMBODIMENTS

Figure 1:
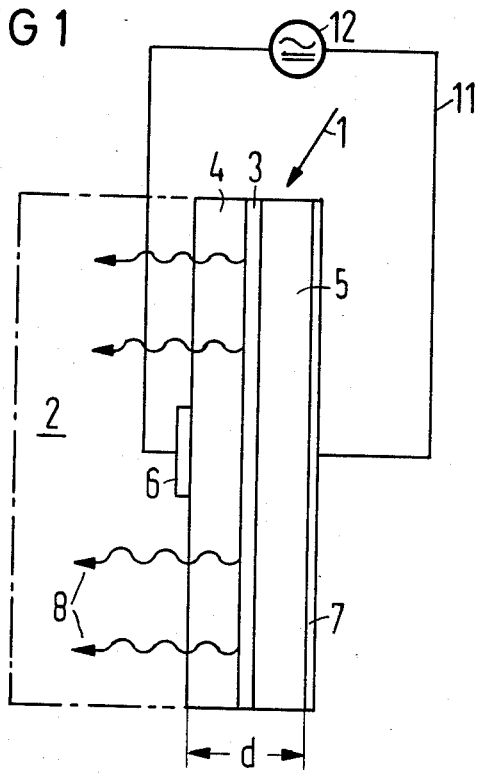
FIG. 1 illustrates a diode designed according to the invention.

FIG. 1 designates a mixed crystal layer manufactured by means of epitaxy, and consisting of, for example, gallium-aluminum-arsenide, whose thickness d is provided in an exaggerated manner. Actual layer thicknesses of completed luminescent diodes according to the invention lie in the size range of 150 to 200 μm. The epitaxial deposition of the mixed crystal layer 1 proceeds on a substrate member, illustrated in broken lines, consisting of, for example, gallium arsenide. Already in the manufacturing process of a luminescent diode according to the invention, this substrate member 2 is again removed, since it absorbs the emitted radiation.

Figure 2:
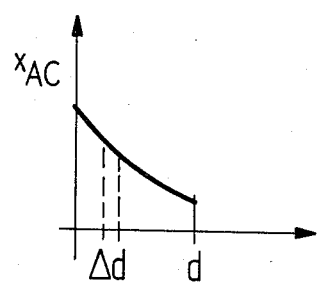
FIG. 2 illustrates a diagram of the distribution for aluminum.

FIG. 2 illustrates the thickness d of the mixed crystal layer 1 plotted on the ordinate versus the x-concentration of aluminum in the respective layer plane Δ d.

Reference numeral 3 illustrates the most important layer plane of the pn-junction disposed between the n-conductive layer portion 4 and the p-conductive layer portion 5 of the entire mixed crystal layer. Numerals 6 and 7 designate current electrodes for the mixed crystal layer 1. At least electrode 6 is designed in the form of a point, ring, or strip contact through which the radiation emerges.

The electroluminescent recombination radiation 8 produced in the pn-junction layer 3 can leave through junction 3 without significant absorption by the layer component 4, since this layer component 4 has a greater bandgap as a consequence of the higher aluminum concentration (in comparison with the layer component of the pn-junction 3).

Reference numeral 11 refers as a whole to the current circuit between the exterior contacts of the electrodes 6 and 7 in which a particular modulatable current source 12 is disposed.

The material of the mixed crystal layer 1 is preferably gallium-aluminum-arsenide. The known constant decrease of concentration of the aluminum content in the layer 1 resulting during the epitaxial growth of the mixed crystal layer 1 on the substrate member 2 is based on the high distribution coefficient of the aluminum in the epitaxial growth from a aluminum-gallium-arsenic melt. In comparison with a known Si-doped gallium-alluminum-arsenide infrared luminescent diode, the diode of this invention has at least only half as great a half-intensity width of the spectral emission d. The narrower-band emission radiation of the inventive diode can therefore be far better optically distinguished from the radiation of additional luminescent diodes of another type which, for example, are employed in one and the same arrangement together with inventive luminescent diodes. In a simple fashion, with inventive luminescent diodes, it is possible to conceive multi-channel apparatus operating on several optical frequencies. For example, an ultrared-remote control of television apparatus could include television channel selection, volume control, picture brightness and/or contrast control, etc.

Figure 3:
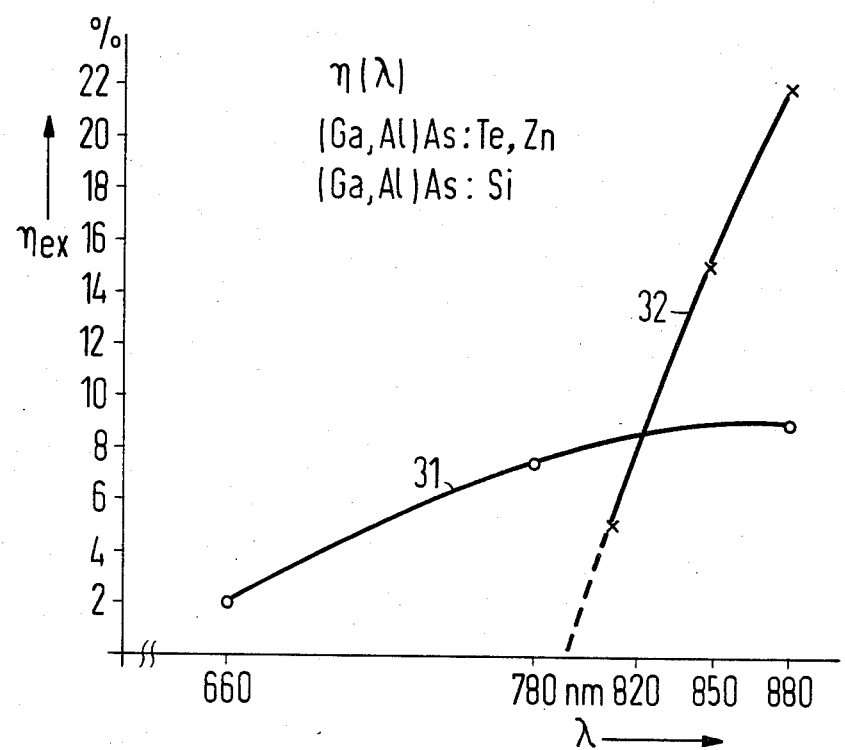
FIG. 3 illustrates a diagram of the efficiency.

For battery-operated remote control apparatus, the high electro-optical efficiency of the inventive luminescent diodes is of great significance. FIG. 3 shows with curves 31 and 32 the optical efficiency of the inventive and known Si-doped diodes. On the abscissa, the wavelength of the emitted radiation is plotted. On the ordinate, the efficiency is plotted. The high electro-optical efficiency extending into the visible red range is striking.

An inventive gallium-aluminum-arsenide luminescent diode with tellurium and zinc doping has a modulating capability with a decay time of the luminescence having a maximum of 50 ns and preferably of 10 to 20 ns. Such an inventive diode can even be employed for video band signal transmission in connection with apparatus which are provided for video games. For an inventive luminescent diode, or for its manufacture, it is important that the gradient of the aluminum distribution in the mixed crystal layer 1 (in comparison with a known diode as previously described) is steep at least in the region of the pn-junction. A disadvantageous absorption can thus be prevented which, in comparison with a known diode, in the case of the invention could be relatively great since the emission of the inventive diode proceeds closer to the band edge than is the case for a diode doped with silicon. Greater steepness of the gradient of the aluminum concentration can be achieved through higher aluminum concentration in the epitaxy-initial melt and/or through more rapid cooling of the melt during the epitaxy process.

Although various minor modifications may be suggested by those versed in the art, it should be understood that I wish to embody within the scope of the patent warranted hereon, all such embodiments as reasonably and properly come within the scope of my contribution to the art.

We claim as our invention:

1. A method for the manufacture of a luminescent diode with a predetermined emission wavelength maximum, comprising the steps of:

determining a desired emission wavelength maximum;

providing a substrate member with a deposition face;

providing a melt to be deposited and which comprises the elements $Ga_{1-x}Al_xAs$, and which also contains an n-conductivity doping component selected from the group consisting of sulfur, selenium, and tellurium;

depositing said melt onto said deposition face in a continuous single step liquid phase epitaxial procedure so as to continuously grow a single layer in a direction normal to the deposition face of said substrate so as to form an epitaxial material crystal body on the substrate member, said epitaxial deposition resulting in a substantially continuously decreasing value x of the aluminum concentration in said body in said normal direction, a thickness d of said body being 150 to 200 μm measured in said normal direction, said resulting continuously decreasing value x resulting in a continuously decreasing range of band gap values, a specific band gap value within said range corresponding to said predetermined desired emission wave length maximum;

during said single step deposition, adding zinc as a p-conductivity doping component to the melt sufficient to over-compensate said n-conductivity doping component, and starting said adding at a time when said corresponding specific band gap value is attained and continuing until completion of the epitaxial deposition, said zinc-doping producing a p-doped portion of said epitaxially grown body;

removing said substrate member after completion of the epitaxial growth of the body; and providing electrodes on opposite faces of said body.

2. A method according to claim 1 including the step of adding the zinc in a gas phase during the epitaxy.

* * * * *